(12) United States Patent
Kawaguchi et al.

(10) Patent No.: US 6,914,207 B2
(45) Date of Patent: Jul. 5, 2005

(54) PLASMA PROCESSING METHOD

(75) Inventors: Tadayoshi Kawaguchi, Kudamatsu (JP); Tadamitsu Kanekiyo, Kudamatsu (JP); Akihiko Mitsuda, Kudamatsu (JP); Takeshi Shimada, Hikari (JP); Saburou Kanai, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/688,991

(22) Filed: Oct. 21, 2003

(65) Prior Publication Data

US 2004/0079733 A1 Apr. 29, 2004

Related U.S. Application Data

(62) Division of application No. 10/083,252, filed on Feb. 27, 2002.

(51) Int. Cl.[7] .................................................. B23K 9/00
(52) U.S. Cl. .............................. 219/121.36; 118/723 I
(58) Field of Search ....................... 219/121.36, 121.39, 219/121.4, 121.43, 121.44; 156/345.24, 345.25, 345.33, 345.48; 118/712, 713, 723 I

(56) References Cited

U.S. PATENT DOCUMENTS

| | | | |
|---|---|---|---|
| 5,647,913 A | * | 7/1997 | Blalock .................... 118/723 I |
| 5,837,094 A | | 11/1998 | Tsukazaki et al. |
| 5,846,373 A | | 12/1998 | Pirkle et al. |
| 6,054,013 A | * | 4/2000 | Collins et al. .......... 156/345.27 |
| 6,084,763 A | * | 7/2000 | Hirano et al. ................ 361/234 |
| 6,171,438 B1 | * | 1/2001 | Masuda et al. ......... 156/345.27 |
| 6,308,654 B1 | * | 10/2001 | Schneider et al. ......... 118/723 I |
| 2001/0008138 A1 | | 7/2001 | Demos et al. |

FOREIGN PATENT DOCUMENTS

| | | |
|---|---|---|
| JP | 2224232 | 9/1990 |
| JP | 8078339 | 3/1996 |
| JP | 10-275694 | 10/1998 |
| JP | 11307519 | 11/1999 |
| JP | 2000-323298 | 11/2000 |
| JP | 2001-345311 | 12/2001 |

* cited by examiner

*Primary Examiner*—Tu Hoang
(74) *Attorney, Agent, or Firm*—Antonelli, Terry, Stout & Kraus, LLP

(57) ABSTRACT

In a plasma processing method which comprises supplying a processing gas to a vacuum vessel forming a plasma production part, producing a plasma using an antenna and a Faraday shield which are provided at outer periphery of the vacuum vessel and to which a high-frequency electric power can be applied, and carrying out the processing, a voltage of at least 500 V is applied to the Faraday shield and a sample which is disposed in the vacuum vessel and which is a nonvolatile material as a material to be etched is etched.

7 Claims, 8 Drawing Sheets

(a) BEFORE ETCHING (b) AFTER ETCHING (c) AFTER CLEANING WITH $BCl_3/Cl_2$

PLASMA PROCESSING METHOD

CROSS REFERENCE TO RELATED APPLICATION

This is a divisional of U.S. application Ser. No. 10/083,252, filed Feb. 27, 2002, the subject matter of which is incorporated by reference herein.

BACKGROUND OF THE INVENTION

The present invention relates to a plasma processing method which comprises carrying out etching of samples and cleaning of inner wall of vacuum vessels with plasma.

In the field of production of semiconductor devices, nonvolatile materials are being used as materials to be etched for FRAM (Ferroelectric Random Access Memory) or MRAM (Magnetic Random Access Memory) in addition to materials such as Si, Al and $SiO_2$ which have been used as materials to be etched for DRAM (Dynamic Random Access Memory) or LOGIC. The nonvolatile materials are difficult to etch because reaction products at the time of etching are high in melting point. Furthermore, since reaction products after etching are low in vapor pressure and high in coefficient of adhesion to inner wall of vacuum vessels, when several to several hundred samples are processed, the inner wall of the vacuum vessels is covered with deposits, which peel off later to cause formation of many foreign matters. Moreover, the coupling state of an induction antenna and plasma in the reaction vessel is changed by the deposits to cause change with time of etching speed or uniformity, verticality of etching, and state of adhering of side wall to the etched side wall. As examples of the nonvolatile materials, mention may be made of ferromagnetic materials or antiferromagnetic materials used for MRAM or magnetic heads, such as Fe, NiFe, PtMn and IrMn, noble metal materials used for capacitor part or gate part of DRAM, capacitor part of FRAM or element part of TMR (Tunneling Magneto Resistive) of MRAM, such as Pt, Ir, Au, Ta, Ru, and, besides, high dielectric materials such as $Al_2O_3$, $HfO_3$ and $Ta_2O_3$, ferroelectric materials such as PZT (lead titanate zirconate), BST (barium strontium titanate) and SBT (strontium bismuth tantalate).

As one of conventional plasma processing methods and processing apparatuses, there has been an induction type plasma processing apparatus using a coil-shaped antenna provided at outer periphery of a vacuum vessel or a plasma processing apparatus into which a microwave is introduced. In both the apparatuses, the countermeasure against deposits on the inner wall of the vacuum vessel in etching of nonvolatile materials is not sufficient, and, hence, cleaning with atmospheric exposure has been repeatedly carried out. When cleaning is carried out once, 6–12 hours are required before starting of next processing of the sample to cause deterioration of working efficiency of the apparatuses.

On the other hand, there has been proposed an apparatus according to which a Faraday shield is provided between antenna and plasma and electric power is supplied by connecting a high-frequency electric source to the Faraday shield, whereby deposition of reaction products on the inner wall of vacuum vessel is inhibited and cleaning of the inner wall of the vacuum vessel can be performed. As examples thereof, there are techniques disclosed in JP-A-10-275694 and JP-A-2000-323298.

SUMMARY OF THE INVENTION

The above prior art have not made sufficient investigations on etching method and cleaning method.

Therefore, the object of the present invention is to provide a plasma processing method and a plasma processing apparatus according to which deposition of reaction products on the inner wall of a vacuum vessel in the processing of samples can be inhibited or the deposited reaction products can be efficiently removed in the plasma processing apparatus in which a Faraday shield is provided between an induction antenna and plasma.

The present invention employs the following method and apparatus for attaining the above object.

In a plasma processing method where a processing gas is supplied to a vacuum vessel which forms a plasma production part and plasma is produced using an antenna and a Faraday shield which are provided at an outer periphery of the vacuum vessel and to which a high-frequency electric power can be applied, whereby the processing is carried out, a voltage of at least 500 V is applied to the Faraday shield to carry out etching of a sample which is disposed in the vacuum vessel and which is a nonvolatile material as a material to be etched.

In an apparatus for plasma processing which has a vacuum vessel forming a plasma producing part, a gas supplying means for supplying a gas to the vacuum vessel, an antenna generating an electric field in the plasma producing part, a Faraday shield provided at outer periphery of the vacuum vessel, a high-frequency electric source supplying a high-frequency electric power to the antenna and the Faraday shield, and an end point determination and detection means, the end point determination and detection means detects the end point of cleaning of the inner wall of the vacuum vessel by detecting emission wavelength of reaction products or a products formed from the vacuum vessel.

DESCRIPTION OF THE PREFERRED EMBODIMENTS

Figure 1:
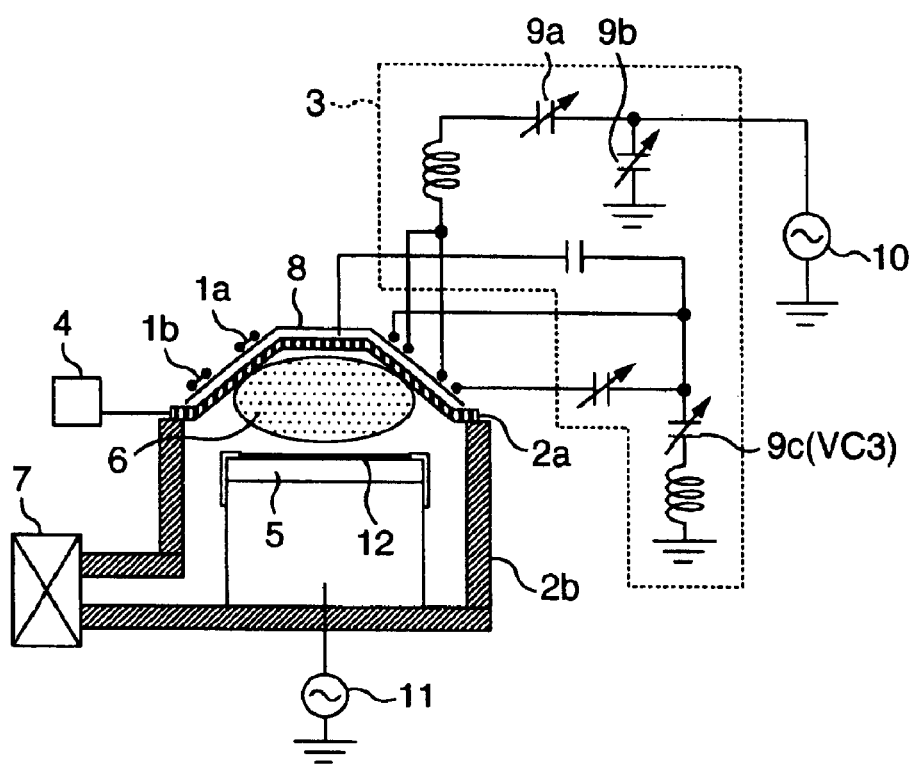
FIG. 1 is a sectional view of a plasma processing apparatus used in the present invention.

The present invention will be explained below, referring to the drawings. FIG. 1 is a sectional view of a plasma processing apparatus of the present invention. Vacuum vessel including parts 2a and 2b has therein a discharge part 2a which comprises an insulation material (e.g., non-conductive materials such as quartz, ceramics, etc.) and which forms a plasma producing part and a processing part 2b in which a sample 12 to be processed and an electrode 5 for placing the sample 12 thereon are disposed. The processing part 2b is grounded to an earth and the electrode 5 is set at the processing part 2b with interposing an insulation material between them. A coil-shaped inductively coupled antenna including parts 1a and 1b is disposed at outer periphery of the discharge part 2a. Furthermore, a disc-like Faraday shield 8 which capacitively couples with plasma 6 is provided outside the discharge part 2a. The inductively coupled antenna and the Faraday shield 8 are connected in series to a first high-frequency electric source 10 through a matching device (matching box) 3. Furthermore, a circuit whose impedance can be varied is grounded to earth in parallel with the Faraday shield 8. A processing gas is supplied into the vacuum vessel from a gas supplying device 4 and simultaneously the pressure is reduced to a given pressure to perform exhaustion by an exhaust device 7. The processing gas is supplied into the vacuum vessel from the gas supplying device 4, and this processing gas is converted to plasma by the action of an electric field generated by the inductively coupled antenna and the Faraday shield 8. A second high-frequency electric source 11 is connected to the electrode 5. Moreover, an electric field for production of plasma is obtained by supplying to the inductively coupled antenna 1 and the Faraday shield 8 a high-frequency electric power generated by the first high-frequency electric source 10, e.g., an HF band such as 13.56 MHz, 27.12 MHz, or 40.68 MHz, or a VHF band further higher in frequency, but in order to inhibit reflection of the electric power, impedance of the inductively coupled antenna is matched with output impedance of the first high-frequency electric source 10 using the matching device (matching box) 3. The matching device (matching box) 3 used generally includes two variable condensers 9a and 9b capable of varying electrostatic capacity which are called inverted L type. Furthermore, in order to lead ions present in the plasma 6 to the sample 12, a bias voltage is applied to the electrode 5 by the second high-frequency electric source 11.

Figure 2:
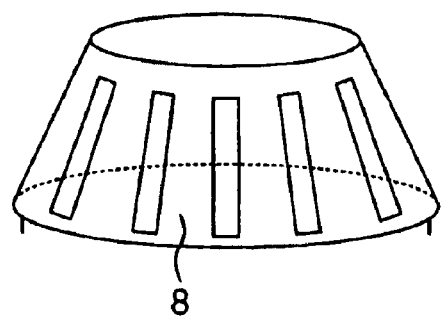
FIG. 2 is a schematic view of a Faraday shield used in the present invention.

Next, the Faraday shield 8 will be explained in detail. As shown in FIG. 2, the Faraday shield 8 comprises a metal conductor having slits in the form of vertical stripes and is disposed in such a manner that it is superposed upon the vacuum vessel. Application of voltage to the Faraday shield 8 can be controlled by the variable condenser 9c shown by VC3 in FIG. 1. Application of voltage to the Faraday shield 8 can be set at a given value by a processing recipe of the sample.

Next, for attaining optimization of the voltage applied to the Faraday shield 8, the relation between the voltage applied to the Faraday shield 8 and the sheath voltage applied to the inner wall of the vacuum vessel was calculated through simulation.

When a high-frequency voltage Vfs is applied to the Faraday shield 8, a direct voltage Vsh is applied to the inner wall of the vacuum vessel. Therefore, ions in the plasma are accelerated towards the inner wall of the vacuum vessel and strike the wall. This ion acceleration voltage Vsh is given by the following formula (1).

$$Vsh = Vfs/2 * Dsh/((Dfs + Dch/\in) + Dsh) + Vs \quad (1)$$

In the above formula (1), Dsh denotes thickness of a sheath formed on the inner wall of the vacuum vessel, Dch denotes thickness of the vacuum vessel, $\in$ denotes a relative dielectric constant of the vacuum vessel, and Vs denotes a plasma space potential (normally about 15 V). The thickness Dsh of the sheath formed on the inner wall of the vacuum vessel is given by the following formula (2).

$$Dsh = 1E3 * (2^{6/4})/3 * (ICF/8.85E-12)^{-0.5} * ((Mi/1.602E-19)^{-0.25} * Vsh^{0.76} \quad (2)$$

In the above formula (2), ICF denotes a saturated current density of plasma and Mi denotes an ion mass. The above formulas of Vsh and Dsh are simultaneous and have non-linear dependence.

Figure 3:
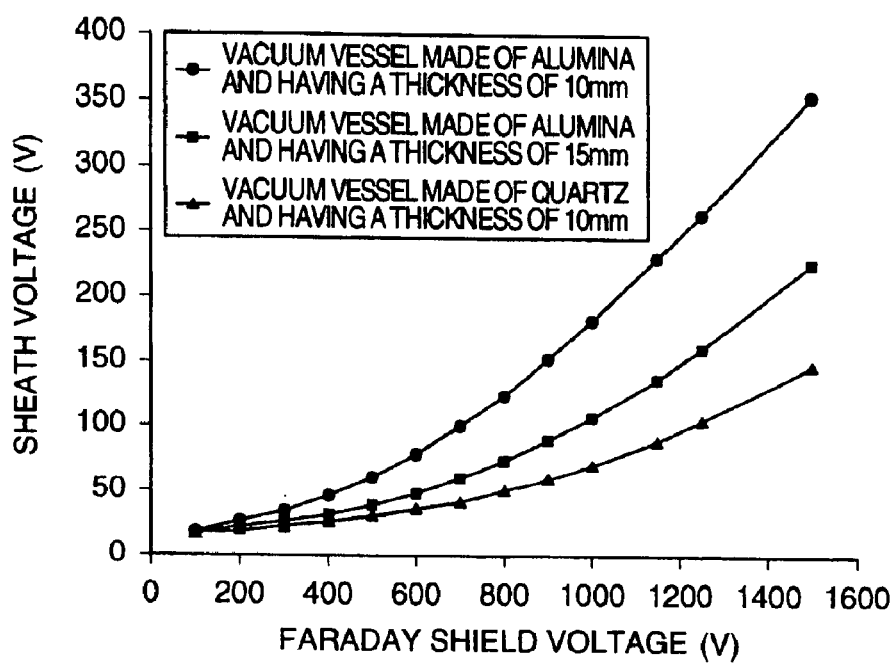
FIG. 3 is a graph which shows a relation between Faraday shield voltage and sheath voltage.

FIG. 3 shows the relation between voltage Vfs applied to the Faraday shield 8 and sheath voltage Vsh in the case of using alumina vacuum vessels of 10 mm and 15 mm in thickness and a quartz vacuum vessel of 10 mm in thickness. In this case, plasma is chlorine plasma and saturated ionic current is 4 mA/cm$^2$. It can be seen that in the case of the alumina vacuum vessel of 10 mm in thickness, when a voltage of 500 V is applied to the Faraday shield 8, the sheath voltage is about 60 V, and when a voltage of 1500 V is applied, the sheath voltage is about 360 V. Furthermore, in the case of an alumina vacuum vessel of 15 mm in thickness or a quartz vacuum vessel of 10 mm in thickness, the sheath voltage lowers to 70% and 40% of the sheath voltage obtained using the alumina vessel of 10 mm in thickness, respectively, and it can be seen that for obtaining the similar effects, the higher voltage must be applied.

Figure 4:
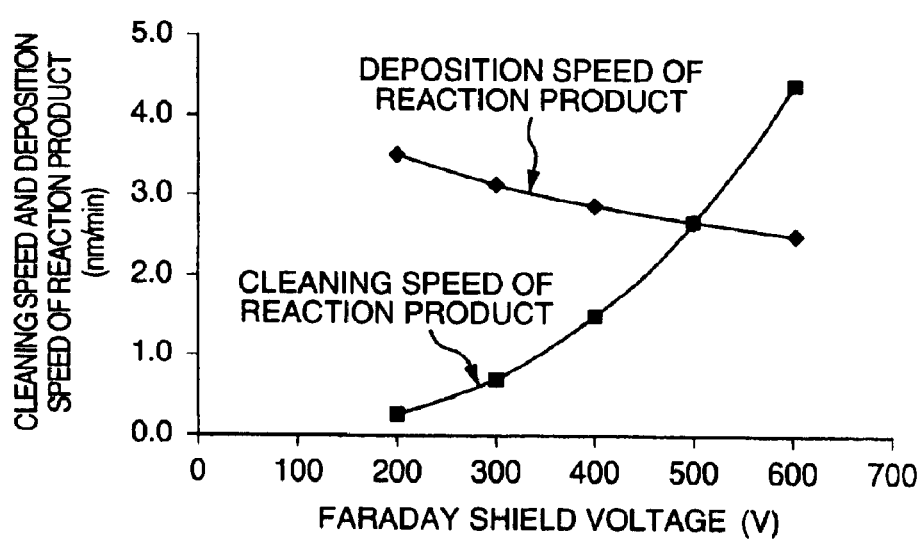
FIG. 4 is a graph which shows a relation between Faraday shield voltage and cleaning speed and deposition speed of reaction product.

FIG. 4 shows deposition speed of the reaction product deposited on the inner wall of the vacuum vessel when Pt, namely, the material to be etched on the sample is etched in the alumina vacuum vessel of 10 mm in thickness and further shows reaction product cleaning speed for removing the reaction product deposited on the inner wall of the vacuum vessel by applying a voltage to the Faraday shield 8. It can be seen from FIG. 4 that the reaction product deposition speed and the reaction product cleaning speed nearly match with each other when the Faraday shield voltage is about 500 V. That is, it can be seen that in processing of Pt, no reaction product deposits on the inner wall of the vacuum vessel by applying a Faraday shield voltage of about 500 V. Moreover, since the inner wall of the vacuum vessel is not excessively cleaned, alumina of the inner wall of the vacuum vessel is not damaged and a stable processing is possible over a long period of time. Thus, deposition of the reaction product on the inner wall of the vacuum vessel during the etching can be inhibited.

Figure 5:
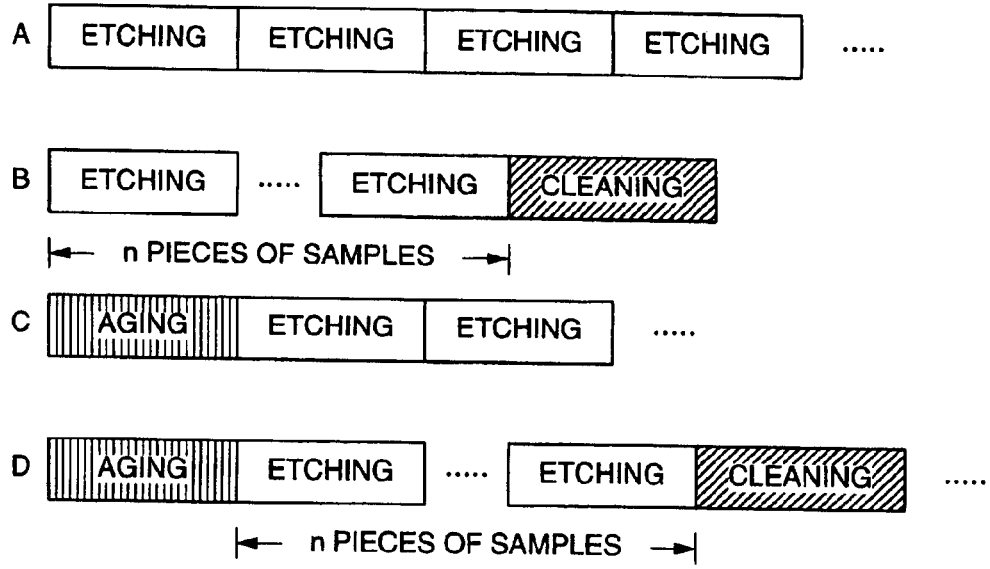
FIG. 5 is a diagram which shows the plasma processing method of the present invention.

Next, various plasma processing methods will be explained referring to FIG. 5.

The processing method shown in A is a method of carrying out the processing under application of Faraday shield voltage for inhibition of deposition of the reaction product on the inner wall of the vacuum vessel in etching of a sample. According to this method, deposition of the reaction product on the inner wall of the vacuum vessel can be diminished, and, hence, stable discharging can be attained. Furthermore, since the number of washing or cleaning can be reduced, working efficiency of the apparatus is high.

The processing method shown in B is a method of carrying out the cleaning every after n pieces of samples are etched. This processing method is employed in case the reaction product cannot be completely removed even if etching is carried out under application of a voltage to the Faraday shield or is employed for such processing as taking preference of the etching speed without application of voltage to the Faraday shield. According to this method, a gas different from the etching gas for the sample can be used for cleaning. Therefore, when a gas high in cleaning effect is selected, the reaction product can be completely removed. Moreover, cleaning time can be shortened.

The processing method shown in C is a method in which an aging treatment is carried out before the processing method of A. This method is used for obtaining a stable state of the apparatus immediately after washing which involves atmospheric exposure. In the apparatus after subjected to washing, various materials adhere to the inner wall of the vacuum vessel and foreign matters are apt to be produced. Therefore, a dummy wafer is fed to the electrode 5, and plasma discharge mainly composed of chlorine gas is generated under application of a voltage of at least 500 V to the Faraday shield, thereby carrying out the treatment to diminish the foreign matters in the vacuum vessel. Thereafter, etching is carried out, whereby influence by the foreign matters can be reduced.

The processing method shown in D comprises combination of the aging treatment explained as to C and the cleaning explained as to B. This is a method suitable when production of foreign matters, change of discharge state and change with time of process are particular problems. By using this processing method in the conventional process in which washing which involves atmospheric exposure must be frequently carried out, also, diminishment of foreign matters can be attained, besides a stable etching performance can be obtained, and working efficiency of the apparatus can be improved.

Examples where various nonvolatile materials are etched by the processing method of the present invention will be explained below.

Figure 6:
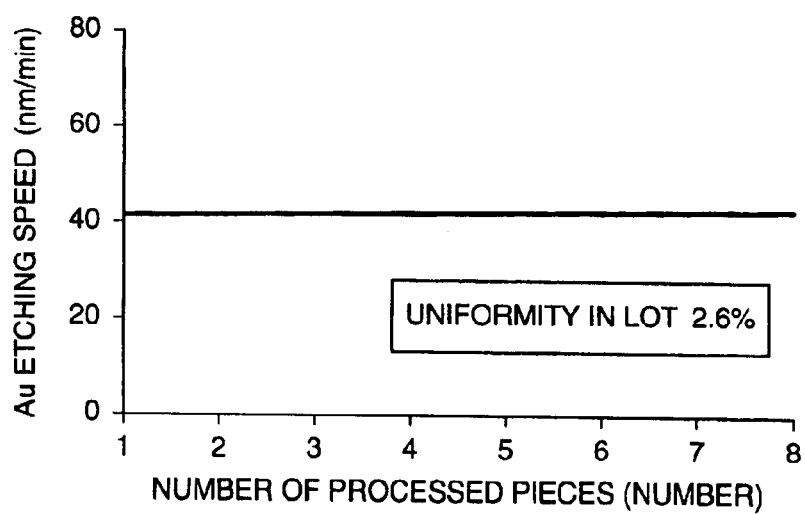
FIG. 6 is a graph which shows a relation between the number of processed samples and etching speed of Au.

FIG. 6 shows the etching speed when 1 lot (8 pieces) of Au were continuously processed by applying a voltage of about 600 V to the Faraday shield. It can be seen that if the processing was carried out without applying the Faraday shield voltage, plasma disappeared by the influence of reaction product at the processing of the eighth wafer, and continuation of the etching was impossible while if the processing with application of voltage to the Faraday shield was carried out, a stable processing of 2.6% in uniformity of the etching speed in the lot could be performed. The uniformity in the lot means variation of etching speed of wafers in one lot (for example, a unit of 8 wafers, 12 wafers, 25 wafers), and the lower value means that the stabler etching was performed. As in the etching of Au, a stable etching speed was also obtained in the etching of NiFe, and the uniformity in the lot was 1.3%. Furthermore, in the etching of FeN, the uniformity in the lot was about 3%, and stable etching could be performed.

Figure 7:
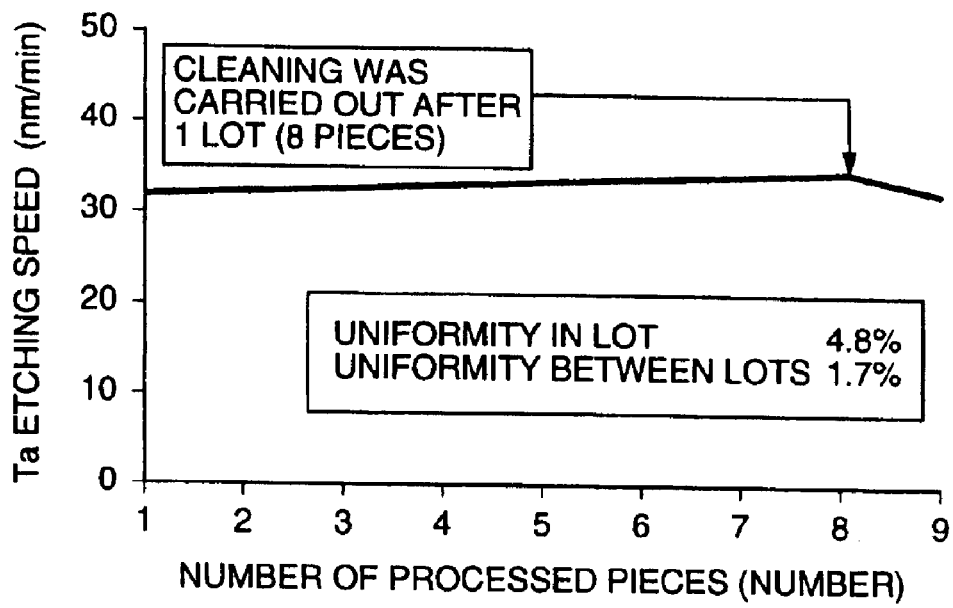
FIG. 7 is a graph which shows a relation between the number of processed samples and etching speed of Ta.

FIG. 7 shows etching speed when 1 lot (8 pieces) of Ta were continuously processed without applying a voltage to the Faraday shield. In the processing of Ta, since etching speed is in preference to the change with time, the processing is carried out without applying the Faraday shield voltage. Thereafter, in order to remove the reaction product adhering to the inner wall of the vacuum vessel, cleaning was carried out after processing of 1 lot. The uniformity in the lot was about 4.8%, and the uniformity between the lots by carrying out the cleaning was about 1.7%. The uniformity between the lots means variation of etching speed of, for example, the first wafer in each lot, and the lower value means that the stabler etching was performed.

Figure 8:
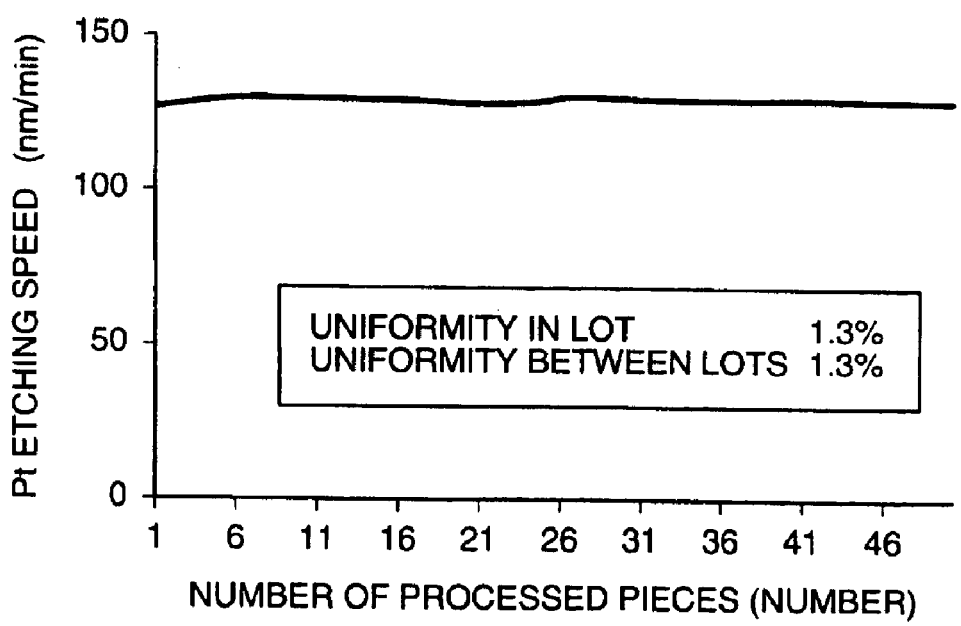
FIG. 8 is a graph which shows a relation between the number of processed samples and etching speed of Pt.

FIG. 8 shows etching speed when Pt was processed by applying a voltage of about 700 V to the Faraday shield. A cleaning which comprised applying a voltage of 1500 V to the Faraday shield was carried out for about 10 minutes after processing of 1 lot (25 pieces), and as a result, stable processing of about 1.3% in both the uniformity in the lot and the uniformity between the lots could be performed. Moreover, as for Ir, when processing was carried out by applying a voltage of about 600 V to the Faraday shield, and the above cleaning was carried out after processing of 1 lot (25 pieces), a uniformity in the lot of about 2.9% and a uniformity between the lots of about 3% could be obtained.

Next, a method of determination of end point for detecting an end point of a cleaning time for cleaning in a proper time the reaction product adhering to the inner wall of the vacuum vessel using the Faraday shield will be explained referring to FIG. 9 and FIG. 10. The abscissa axis shows cleaning time and the ordinate axis shows emission intensity.

Figure 9:
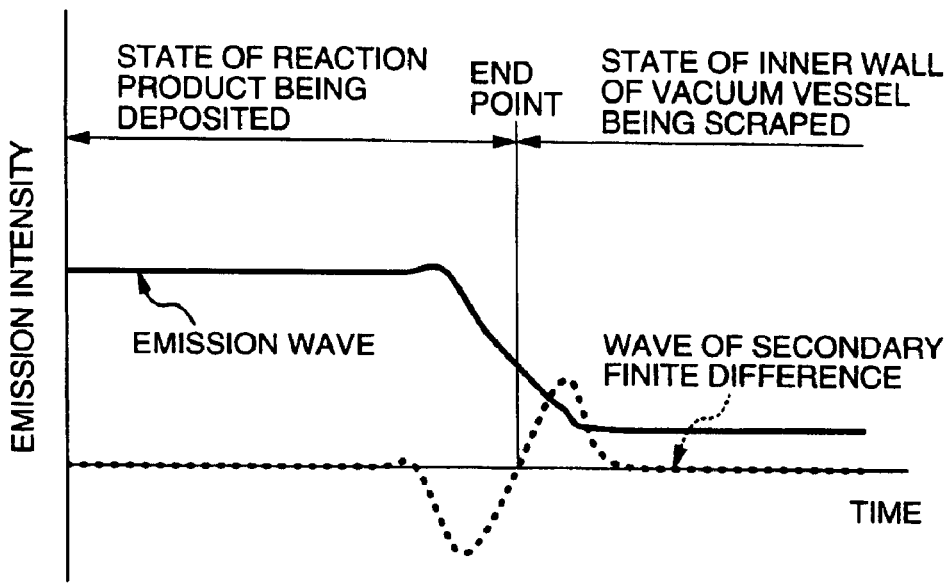
FIG. 9 is a diagram which shows a method of determination of end point in the present invention.

FIG. 9 shows a method of determination of end point in the case of observing wavelength of the reaction product. By applying a voltage to the Faraday shield, the reaction product adhering to the inner wall of the vacuum vessel begins to be removed. Thereby, since the reaction product is ionized and floats in the vacuum vessel, the emission intensity of the reaction product becomes strong. When the reaction product in the vacuum vessel gradually begins to be removed, the emission intensity also lowers and the secondary finite difference of the emission also decreases. The secondary finite difference of the emission gradually begins to rise and when the secondary finite difference of the emission crosses 0, this point is the end point.

Figure 10:
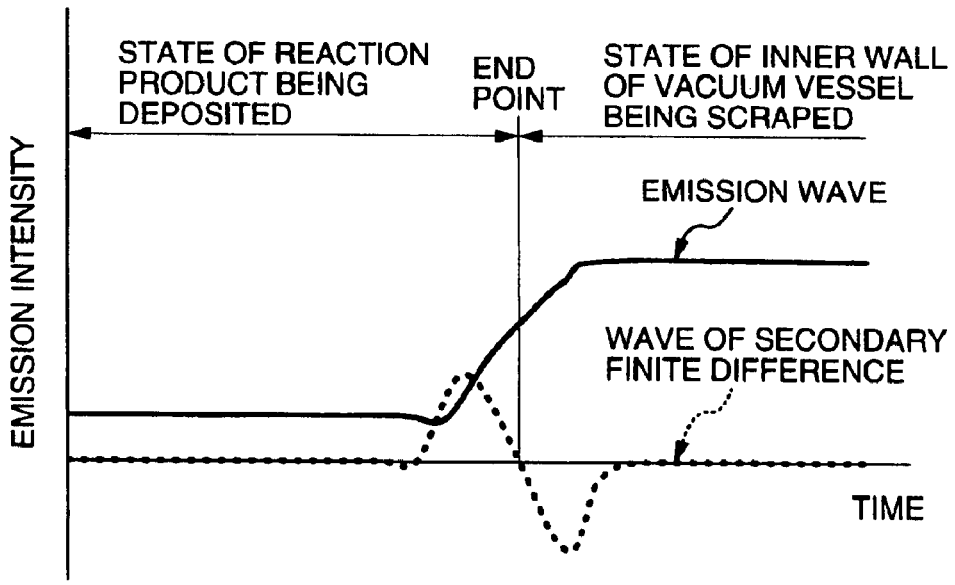
FIG. 10 is a diagram which shows a method of determination of end point in the present invention.

FIG. 10 shows a method of determination of end point in the case of observing wavelength of the product formed from the vacuum vessel per se. For example, when the vacuum vessel is made of alumina, the emission wavelength is 308 nm (Al), 396 nm (Al), or the like, and when it is made of quartz, the emission wavelength is 391 nm (SiCl), 437 nm (SiF), or the like. By applying a voltage to the Faraday shield, the reaction product adhering to the inner wall of the vacuum vessel begins to be removed, but emission intensity is low because the reaction product covers the inner wall of the vacuum vessel. Since the reaction product adhering to the inner wall of the vacuum vessel gradually reduces, the surface layer part of the vacuum vessel appears. Thus, the emission intensity increases, and the secondary finite difference of the emission also rises. The secondary finite difference of the emission gradually begins to descend, and when the secondary finite difference of the emission crosses 0, this point is the end point.

When such method is used, the reaction product does not remain on the inner wall of the vacuum vessel and, besides, the inner wall of the vacuum vessel is not damaged by excessive cleaning, and therefore the processing can be stably carried out over a long period of time and the life of the vacuum vessel can be prolonged.

Figure 11:
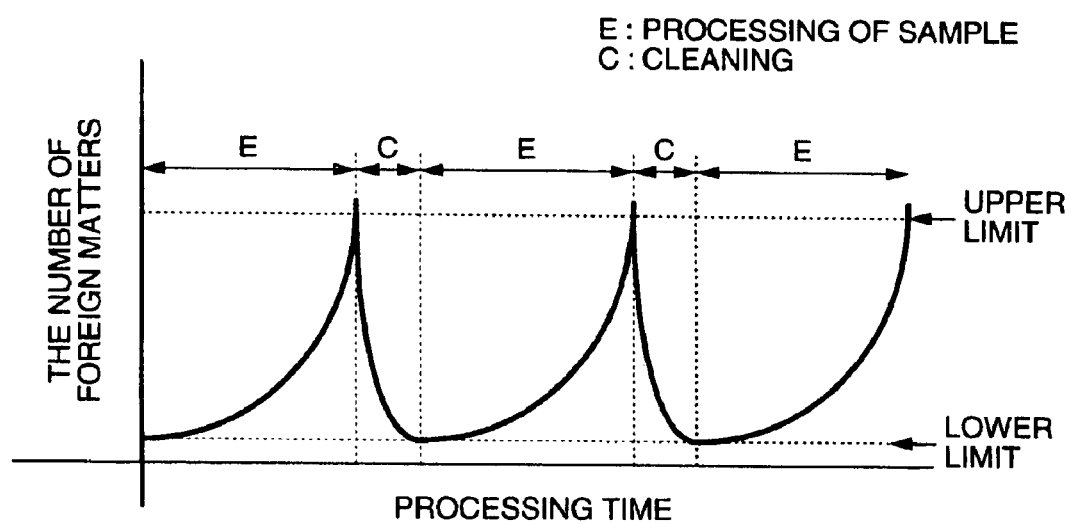
FIG. 11 is a diagram which shows the plasma processing method of the present invention.

Next, optimization of interval between cleanings of the inner wall of the vacuum vessel using a monitor for foreign matters will be explained. Conventionally, in order to inhibit production of defective products caused by unstable etching, the cleanings have been forcedly carried out at previously set intervals, for example, at every one lot. In this example, measurement of foreign matters is carried out at real time during processing of samples, and optimization of cleaning interval is effected on the basis of the previously determined upper limit (for example, the number of foreign matters having the possibility of hindering the etching) and lower limit (for example, the number of foreign matters before the processing of samples). FIG. 11 shows a relation between the processing time and the number of foreign matters. With repeating the processing of the samples, the number of foreign matters in the plasma increases. When the number of foreign matters exceeds the given upper limit during processing of the nth sample, the next (n+1)th sample is not processed after the processing of the nth sample, and at this time a cleaning is carried out by applying a voltage to the Faraday shield. This cleaning is preferably set so as to be able to perform automatically. In this cleaning, monitoring of the number of foreign matters is also carried out, and if the number of foreign matters reduces below the given lower limit, the cleaning is stopped and processing of the (n+1)th sample is started. By repeating this procedure, optimization of cleaning interval can be attained, and working efficiency of the apparatus is improved.

Figure 12:
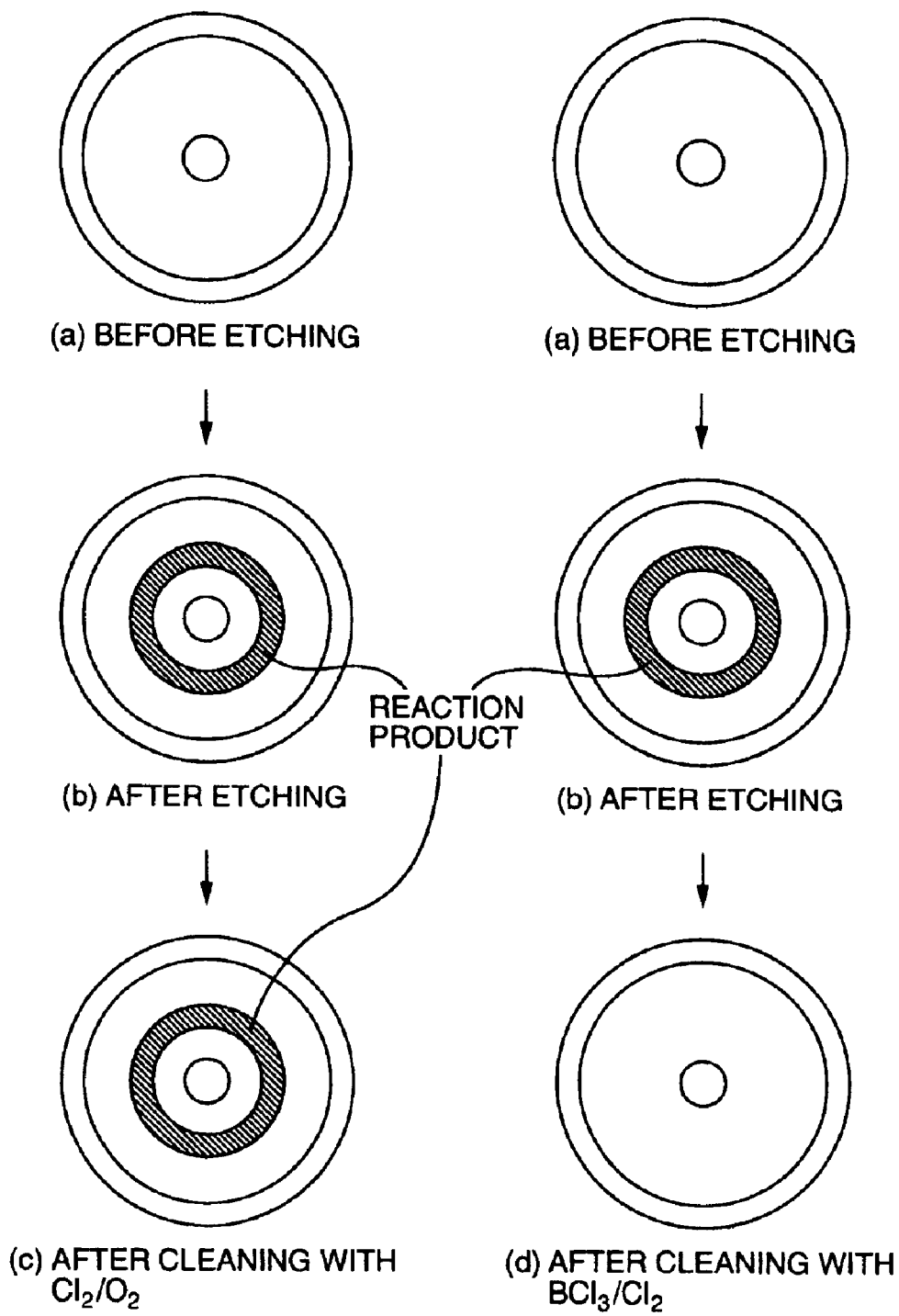
FIG. 12 is a diagram which shows results of cleaning according to the present invention.

Next, a cleaning with a mixed gas comprising boron trichloride and chlorine will be explained. FIG. 12(a) shows inside of the discharge part 2a of a vacuum vessel made of alumina before carrying out the etching of Ru. Furthermore, (b) shows the state after etching. The portion which is seen black is the portion on which the reaction product is deposited. For removing this reaction product, cleaning was carried out for about 30 minutes using a mixed gas of chlorine and oxygen as a cleaning gas, and the result is shown in (c). The reaction product could not be completely removed. Next, etching was carried out under the same conditions, and then cleaning was carried out for about 30 minutes using a mixed gas of boron trichloride and chlorine. The result is shown in (d). The reaction product could be removed nearly completely.

Figure 13:
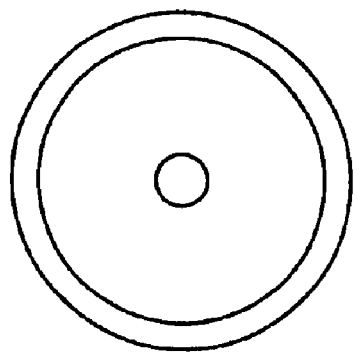
FIG. 13 is a diagram which shows results of cleaning according to the present invention.
Figure 13:
Figure 13:
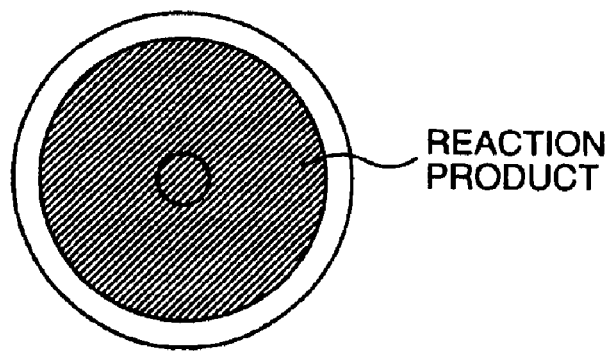
Figure 13:
Figure 13:
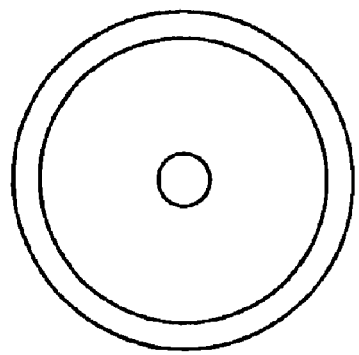

FIG. 13(a) shows the inside of the discharge part 2a of a vacuum vessel made of alumina before carrying out the etching of Au. Furthermore, in (b), the etching was carried out without applying a voltage to the Faraday shield, and it can be seen that the reaction product was deposited on the whole surface. In order to remove this reaction product, cleaning was carried out for about 10 minutes using a mixed gas of boron trichloride and chlorine, and the reaction product could be removed nearly completely as shown in (c).

As mentioned above, a mixed gas of boron trichloride and chlorine is high in efficiency as a cleaning gas, and a mixed gas comprising 20% of boron trichloride and 80% of chlorine is most effective for cleaning. It is further found that a mixed gas of boron trichloride and chlorine has cleaning effect for reaction products produced by etching of various nonvolatile materials.

As explained above, the present invention provides a plasma processing method and an apparatus, according to which deposition of reaction products on the inner wall of vacuum vessel during processing of samples can be inhibited for any nonvolatile samples by applying an optimum Faraday shield voltage, and, besides, reaction products deposited on the inner wall of vacuum vessel can be efficiently removed.

It should be further understood by those skilled in the art that the foregoing description has been made on embodiments of the invention and that various changes and modifications may be made in the invention without departing from the spirit of the invention and the scope of the appended claims.

What is claimed is:

1. A plasma processing method comprising the steps of:
    supplying a processing gas to a vacuum vessel forming a plasma production part, and having a sample disposed therein;
    producing a plasma using an antenna and a Faraday shield arranged at outer periphery of the vacuum vessel and having a high-frequency electric power applied to the antenna and the Faraday shield; and
    carrying out processing of the sample;
    wherein a voltage of at least 500 V is applied to the Faraday shield, and the sample which is disposed in the vacuum vessel is a nonvolatile material as a material to be etched is etched.

2. A plasma processing method comprising the steps of:
    supplying a processing gas to a vacuum vessel forming a plasma production part;
    producing a plasma using an antenna and a Faraday shield arranged at outer periphery of the vacuum vessel and having a high-frequency electric power applied to the antenna and the Faraday shield and
    carrying out processing;
    wherein a voltage of at least 500 V is applied to the Faraday shield, and reaction products deposited on the inner wall of vacuum vessel are removed therefrom.

3. A plasma processing method according to claim 2, wherein the processing gas is a mixed gas comprising boron trichloride and chlorine.

4. A plasma processing method according to claim 3, wherein the processing gas is supplied so that the mixed gas comprises 20% of boron trichloride and 80% of chlorine, thereby cleaning the inner wall of the vacuum vessel to remove the reaction products deposited thereon.

5. A plasma processing method according to claim 2, wherein a voltage of at least 1500 V is applied to the Faraday shield.

6. A plasma processing method comprising the steps of:
    supplying a processing gas to a vacuum vessel forming a plasma production part;
    producing a plasma using an antenna and a Faraday shield arranged at outer periphery of the vacuum vessel and having a high-frequency electric power applied to the antenna and the Faraday shield; and
    carrying out processing,
    wherein the method further comprises a first step of carrying a dummy wafer onto a sample stand, applying a voltage of at least 500 V to the Faraday shield and removing foreign matters in the vacuum vessel with a plasma using a gas containing chlorine, a second step of etching a sample which is disposed on the sample stand in the vacuum vessel and which is a nonvolatile material as a material to be etched after the first step, and a third step of applying a voltage of at least 1500 V to the Faraday shield after the second step, and removing reaction products in the vacuum vessel using a mixed gas comprising boron trichloride and chlorine.

7. A plasma processing method comprising the steps of:
    supplying a processing gas to a vacuum vessel forming a plasma production part, producing a plasma using an antenna and a Faraday shield arranged at outer periphery of the vacuum vessel and having a high-frequency electric power applied to the antenna and the Faraday shield; and
    carrying out processing of samples;
    wherein the method further comprises detecting a number of foreign matters in the vacuum vessel in real time during the processing of the samples, applying a voltage of at least 500V to the Faraday shield when the number of foreign matters detected exceeds a given upper limit for cleaning of an inner wall of the vacuum vessel and terminating the cleaning when the number of foreign matters detected decreases below a given lower limit.

* * * * *